United States Patent [19]
Kukkonen et al.

[11] Patent Number: 5,044,963
[45] Date of Patent: Sep. 3, 1991

[54] SURFACE CONNECTOR FOR RADIO FREQUENCY SIGNALS

[75] Inventors: Osmo Kukkonen; Antero Väyrynen, both of Salo, Finland

[73] Assignee: Nokia Mobile Phones Ltd., Salo, Finland

[21] Appl. No.: 493,612

[22] Filed: Mar. 14, 1990

[30] Foreign Application Priority Data

Apr. 12, 1989 [FI] Finland .................................. 891744

[51] Int. Cl.⁵ .......................... H01R 4/66; H01R 9/09
[52] U.S. Cl. ........................................ 439/55; 439/63; 439/92
[58] Field of Search ................. 439/55, 63, 65, 92, 439/581

[56] References Cited

U.S. PATENT DOCUMENTS

| 2,707,272 | 4/1955 | Blitz | 439/55 |
|---|---|---|---|
| 3,179,912 | 4/1965 | Huber et al. | 439/63 |
| 3,248,779 | 5/1966 | Yuska et al. | |
| 3,745,510 | 7/1973 | Mallon | |
| 3,848,947 | 11/1974 | Jambor | |
| 4,409,641 | 10/1983 | Jakob et al. | 439/76 |
| 4,428,632 | 1/1984 | Rich | 439/63 |
| 4,764,848 | 8/1988 | Simpson | |

FOREIGN PATENT DOCUMENTS

| 1208375 | 1/1966 | Fed. Rep. of Germany | 439/55 |
|---|---|---|---|
| 2028879 | 10/1970 | France | |
| 2503977 | 10/1982 | France | 439/55 |
| 096046 | 2/1986 | U.S.S.R. | |
| 0932210 | 7/1963 | United Kingdom | 439/55 |
| 1150233 | 4/1969 | United Kingdom | |

Primary Examiner—Gary F. Paumen
Assistant Examiner—Kevin J. Carroll
Attorney, Agent, or Firm—Darby & Darby

[57] ABSTRACT

A low impedance surface connector is arranged on a printed board (10) with printed contacts (1-6) formed by the printed conductors. The contacts (2, 3; 5, 6) for the ground and the sheath are situated in conducting relationship symmetrically on both sides of the signal contact (1; 4) in the plane of the printed board surface (11, 12).

9 Claims, 1 Drawing Sheet

SURFACE CONNECTOR FOR RADIO FREQUENCY SIGNALS

BACKGROUND OF THE INVENTION

The invention relates to a connector for radio frequency signals mounted on a printed board.

Usually coaxial connectors are used to connect radio frequency signals, which are carried on a central contact of the connector. The signal contact is then coaxially surrounded by a cylindrical contact part providing the grounding and the contact for the sheath. A connection comprises two coaxial connectors, a male and a female connector exactly fitting into each other. A connector of this type can also be mounted on a printed board. The known connectors are reliable but expensive due to their construction. The connection of the signal circuits of two printed boards through these connectors further requires an accurate mechanical fitting and a somewhat resilient construction of the mounting, which increases the cost of the connector.

In connection with printed boards for low frequency signals, planar connectors are used, in which the contacts in their simplest form consist of the conductors printed on the board. However, the impedance level and the construction of these known connectors do not meet the requirements for the transmission of radio frequency signals.

SUMMARY OF THE INVENTION

The invention provides a connector to be mounted on a printed board that reliably can be used for the transmission of radio frequency signals, and is substantially more straightforward than the prior art coaxial connectors.

Contacts forming the connector preferably consist of conductors printed on the board so that the contacts for the ground and the sheath are symmetrically situated on both sides of the signal contact. The planar contacts lie in the same plane and form the surface connector. The contacts are preferably on the surface of the printed board, but in another embodiment they may also be located on the edge of the printed board, perpendicular to the surface of the board.

The conductors of the connector according to the invention are dimensioned and located at a mutual distance such that the impedance level of the connector is low, preferably in the range between 50 and 150 ohms.

BRIEF DESCRIPTION OF THE DRAWINGS

The invention will be described in more detail below referring to the enclosed drawing, in which.

DESCRIPTION OF THE PREFERRED EMBODIMENTS

Figure 1:
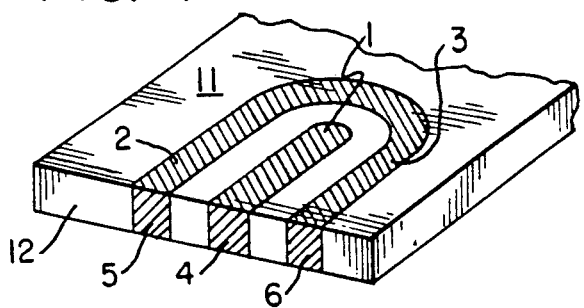
FIG. 1 is a diagrammatic perspective view of the printed board surface connector according to the invention.

In FIG. 1, a printed board 10 is provided with a surface connector with printed contacts 1-3 formed by printed conductors. The contact 1 is the signal contact. The ground contacts 2 and 3 are located symmetrically on both sides of the signal contact, such as in a U-shape as shown, and are electrically conductive. Since the conductors are thin, they may be considered to lie substantially in the plane of the printed board surface 11.

The extensions 4-6 of the conductors continue on the edge surface 12 of the printed board 10, thereby forming contact faces perpendicular to the plane 11.

The other connector of the connection, not shown in the figures, comprises pins fastened in a row, e.g., on a printed board. However, these contacts must be able to yield resiliently, so that the possibility of movement on one hand compensates for any inaccuracies and so that the spring force on the other hand ensures an adequate contact force between the connectors. Such a connector, which is described in the copending U.S. patent application Ser. No. 493,613 with the present application, can be connected either in the direction of the surface 11 of FIG. 1 perpendicularly against the contact faces 4-6, or perpendicularly against the contact points 1-3.

It is not necessary that the printed conductors are extended to the edge surface 12. Instead of printed circuits there may also be used separate metal strips, which electrically conduct and are fastened to the printed board and the conductors.

Figure 2:
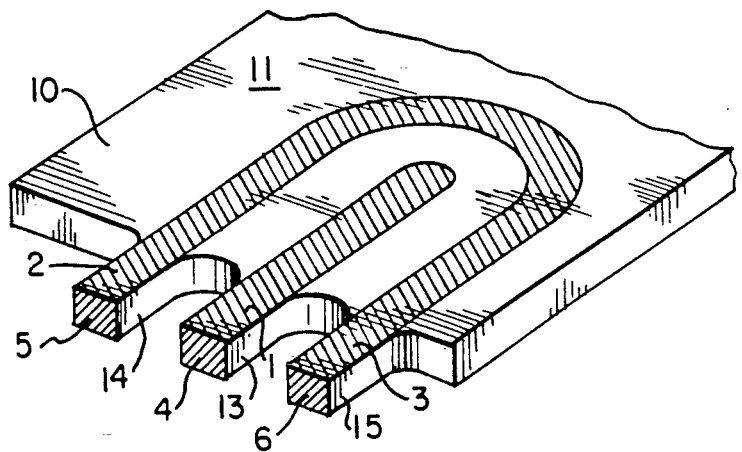
FIG. 2 shows a diagrammatic perspective view of an embodiment further developed from FIG. 1, in which the contacts are situated on parts protruding from the edge of the printed board.

The example shown in FIG. 2 illustrates how the connector according to the invention easily can be made with protruding fingers. The protrusions 13-15 are made when the board 10 is cut, and the contact surfaces 1-3 and 4-6 are made as printed contacts, as are the contacts on the printed board of FIG. 1.

Figure 4:
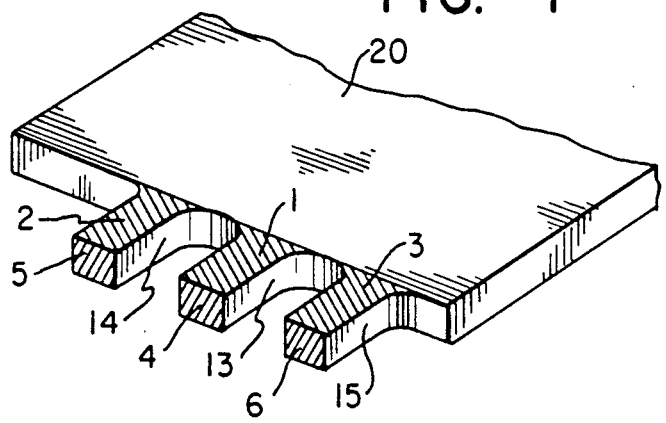
FIG. 4 is a diagrammatic perspective view of the embodiment of FIG. 2 within a housing, but with fingers protruding through the housing.

The printed board in accordance with FIG. 2 can be mounted in a housing 20 (see FIG. 4) so that the connector and the contacts 1-6 protrude outside through an opening in the housing. In this way it is possible to protect the printed board against dust and/or radio frequency interference.

Figure 3:
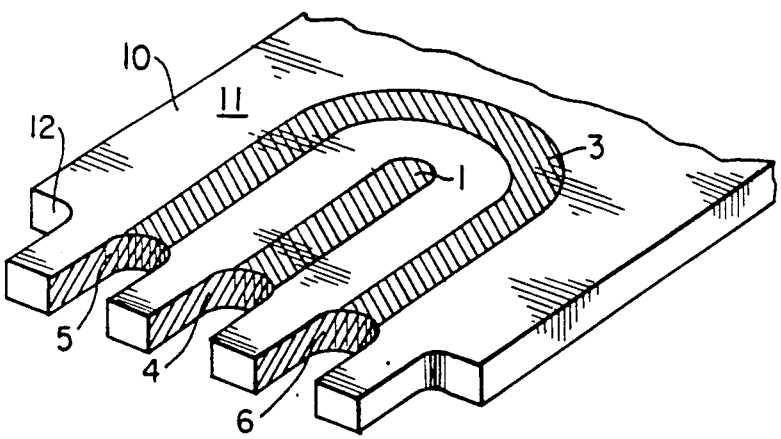
FIG. 3 shows a diagrammatic perspective view of an embodiment somewhat modified compared to FIG. 2.

The embodiment according to FIG. 3 comprises protruding connecting elements analogous to FIG. 2. However, the contact faces 4, 5 and 6 are here formed on the inner faces of notches, the contacts surfaces 1, 3 in the plane 11 ending at the bottom of the notches and joining there the faces 4-6.

The surface connectors in FIGS. 1-3 constitute surface connectors meeting the requirements for radio frequency signals, primarily due to their symmetrical construction. The printed conductors 1-6 may thus be dimensioned (width, thickness, and distances between the conductors) according to methods well known in the art, so that the specific impedance or impedance level of the connector will be e.g. 50 ohms, which is the generally used impedance level on radio frequencies. The symmetrical construction will also reduce (or prevent) stray coupling.

The inventive surface connector described above may in principle also be realized so that the conductors 1-6 are duplicated, or so that there are a plurality of them, depending on the requirements of the circuit design and/or of the mechanical conditions.

We claim:

1. Surface connector arrangement, comprising: a printed circuit board having a planar surface; a ground contact having two legs extending on said surface and into contact with each other for providing a ground; and an elongated signal contact extending on said surface and between said legs for enabling transmission of radio frequency signals, said elongated signal contact being spaced from said ground contact, each of said contacts being arranged for connecting to other contacts on another printed circuit board, said printed circuit board having another surface extending adjacent and substantially perpendicular to said planar surface, said ground and signal contacts extending onto said another surface as respective contact faces.

2. A surface connector as in claim 1, wherein said ground contact is U-shaped and said legs extend symmetrically on both sides of said signal contact.

3. A surface connector as in claim 1, wherein said ground and signal contacts lie in substantially the same plane as said planar surface at locations away from said contact faces.

4. A surface connector as in claim 1, wherein said ground and signal contacts are printed contacts formed by conductors printed on said printed circuit board.

5. A surface connector as in claim 4, which said printed circuit board has protruding fingers spaced from each other, said printed contacts extending onto said fingers.

6. A surface connector as in claim 1, wherein said printed circuit board has protruding fingers spaced from each other, said ground and signal contacts extending in the same plane as said planar surface onto respective ones of said fingers, said fingers each having a free end from which extends said another surface.

7. A surface connector as in claim 1, wherein said printed circuit has protruding fingers spaced from each other and notches between adjacent ones of said fingers, said legs and said signal contact extending to a bottom of said notches and onto said another surface, as said contact faces.

8. A surface connector as in claim 5, 6, or 7, wherein said fingers protrude through a housing.

9. A surface connector as in claim 1, wherein said ground and signal contacts cooperate with each other to provide a specific impedance with a range of 50 to 150 ohms.

* * * * *